US006714095B2

(12) United States Patent
Pavio et al.

(10) Patent No.: US 6,714,095 B2
(45) Date of Patent: Mar. 30, 2004

(54) TAPERED CONSTANT "R" NETWORK FOR USE IN DISTRIBUTED AMPLIFIERS

(75) Inventors: Anthony M. Pavio, Paradise Valley, AZ (US); Lei Zhao, Chandler, AZ (US)

(73) Assignee: Motorola, Inc., Schaumberg, IL (US)

( * ) Notice: Subject to any disclaimer, the term of this patent is extended or adjusted under 35 U.S.C. 154(b) by 4 days.

(21) Appl. No.: 10/174,238

(22) Filed: Jun. 18, 2002

(65) Prior Publication Data

US 2003/0231079 A1 Dec. 18, 2003

(51) Int. Cl.[7] .................................................. H03A 7/38
(52) U.S. Cl. ........................... 333/32; 333/34; 333/246; 333/238
(58) Field of Search ............................ 333/32, 34, 246, 333/238, 175

(56) References Cited

U.S. PATENT DOCUMENTS

| | | | | |
|---|---|---|---|---|
| 5,119,048 A | * | 6/1992 | Grunwell | 333/34 |
| 5,140,288 A | * | 8/1992 | Grunwell | 333/34 |
| 5,436,601 A | | 7/1995 | Mandai et al. | |
| 5,949,304 A | * | 9/1999 | Heine et al. | 333/175 |
| 5,977,850 A | * | 11/1999 | Chaturvedi | 333/238 |
| 6,556,099 B2 | * | 4/2003 | Khan et al. | 333/32 |

FOREIGN PATENT DOCUMENTS

JP 2001036372 2/2001

OTHER PUBLICATIONS

"GaAs MESFET distributed baseband amplifier IC with allpass filter network," S. Kimura et al., Electronics Letters, Oct. 29, 1998, vol. 34, No. 22, pp. 2124–2126.

"Reduction of the chip area of MMIC distributed amplifiers," A. Boifot et al., European Transactions on Telecommunications and Related Technologies, (1990) May/Jun., No. 3, pp. 277–281.

* cited by examiner

*Primary Examiner*—Michael Tokar
*Assistant Examiner*—Lam Mai
(74) *Attorney, Agent, or Firm*—William E. Koch

(57) ABSTRACT

A constant "R" network distributed amplifier formed in a multi-layer, low temperature co fired ceramic structure comprises multiple cascaded constant "R" networks for amplifying a signal applied thereto. Each one of the multiple cascaded constant "R" networks is formed in the ceramic structure and includes a plurality of ceramic layers each of which have a top and bottom planar surfaces which, when bonded together form the ceramic structure. A transmission line is formed on the top surfaces of each of the ceramic layers having a beginning end and a distal end and has a generally rectangular shape. The distal end of the transmission line formed on a lower ceramic layer is connected to the beginning end of the transmission line formed on the next adjacent upper ceramic layer by way of vias formed in the ceramic layers through which metal conductive material is formed there through. The transmission lines and the capacitance established between the individual layers form a LC structure. An output is provided at the middle portion of the transmission line formed on the middle ceramic layer that is coupled to the drain of a FET.

12 Claims, 3 Drawing Sheets

TAPERED CONSTANT "R" NETWORK FOR USE IN DISTRIBUTED AMPLIFIERS

TECHNICAL FIELD

The present invention relates generally to constant "R" networks and, more particularly to a tapered constant "R" network for use in high power, high frequency distributed amplifiers.

BACKGROUND OF THE INVENTION

High powered, high frequency distributed amplifiers are well known in the art, having been around since the 1940's. Distributed or traveling wave techniques have been used to design distributed amplifiers comprising microwave GaAs FETs that operate from 2.0 to 20 GHZ. A discussion of distributed amplifier design is taught in the book entitled "Microwave Circuit Design Using Linear and Non-Linear Techniques" published by John Wiley & Sons in 1990, pages 350–369.

The aforementioned prior art reference teaches the use of both constant K and constant R networks comprising series inductances and shunt capacitances, the latter of which is generally provided by the parasitic drain-to-source capacitance of a FET that is coupled between the series inductances of the network. Multiple sections of these networks are generally cascaded together and, by adjusting the individual phase shift therethrough, the respective gains of each FET stage will add along the associated transmission lines, as is well understood.

Prior art constant "R" distributed amplifiers as aforementioned have generally been fabricated on GaAs substrates. Because the GaAs substrate is formed of a single layer, the efficiency and bandwidth of these amplifiers has been limited. One reason for this is that mutual conductance coupling factor of the series inductances is limited since the series inductance is formed, for an example, by using interwoven spiral transmission lines formed on the surface of the single layer substrate.

Hence, a need exists for an improved, high efficiency, broadband power amplifier.

BRIEF DESCRIPTION OF THE DRAWINGS

The present invention will hereinafter be described in conjunction with the appended figures, wherein like numerals denote like elements, and in which.

DETAILED DESCRIPTION OF THE DRAWINGS

Figure 1:
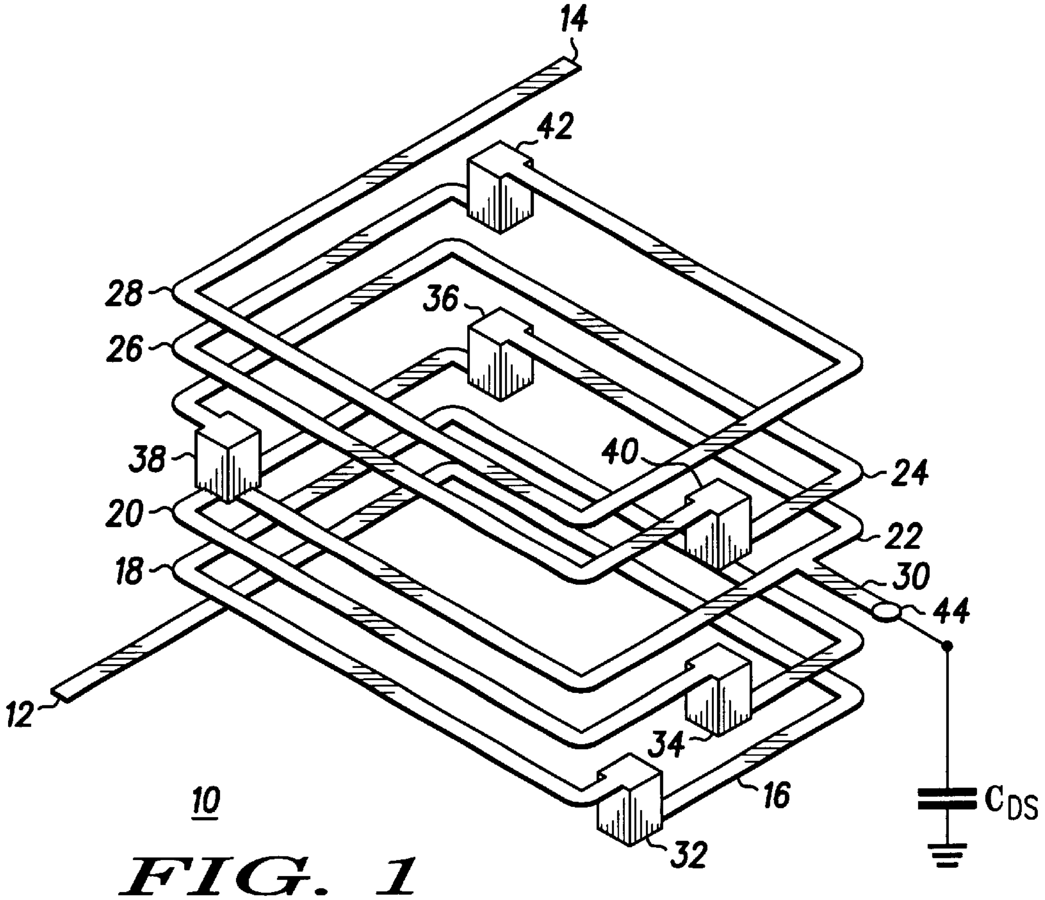
FIG. 1 is an exploded perspective view of the LC structure of the present invention shown connected to parasitic capacitance of a FET device of distributed amplifier forms a novel constant "R" network.
Figure 3:
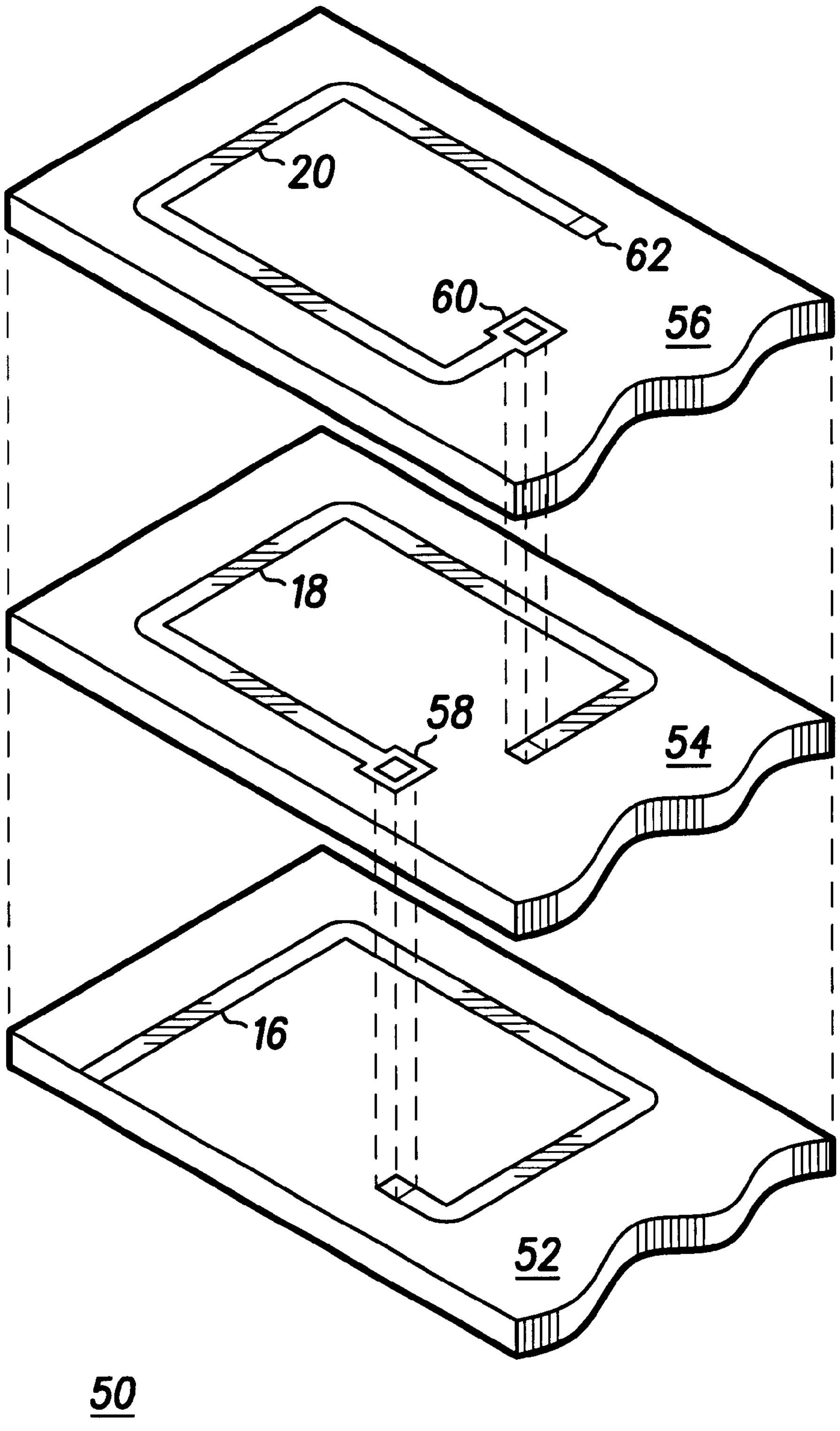
FIG. 3 is an exploded perspective view of several layers of a multi-layer low temperature co fired ceramic structure on which the constant "R" network of a distributed amplifier is formed in accordance with the present invention.

Turning now to the figures, in particular, FIGS. 1 and 3, the high frequency distributed amplifier of the present invention will now be described. An LC structure 10 is illustrated in FIG. 1 that is comprised of multiple transmission lines 16, 18, 20, 22, 24, 26, 28 and 30. As will fully be explained hereinafter, these multiple transmission lines are spaced a predetermined vertical distance apart and are electrically connected by metallic connectors 32, 34, 36, 38, 40, and 42 respectively. As illustrated in FIG. 3, metallic transmission line 16 is formed on upper planar surface of ceramic layer 52. Similarly, transmission line 18 is formed on the upper planar surface of ceramic layer 54. Ceramic layer 54 is shown having via 58 formed at the beginning end of transmission line 18 which directly overlays the distal end of transmission line 16. As understood, during the fabrication of multi-layer ceramic structure 50, metallic connector 32 is formed through via 58 to electrically connect transmission line 18 to transmission line 16. Likewise, via 60 is formed through ceramic layer 56 while transmission line 20 is formed on the upper planar surface thereof. Metallic connector 34 is then formed through via 60 to electrically connect the distal end of transmission line 18 to the beginning end of transmission line 20. In a continuing manner, each of the remaining transmission lines 22, 24, 26, and 28 are formed on the upper planar surfaces of multiple ceramic layers (not shown) respectively. Vias are formed through the multi ceramic layers for connecting the distal end of the next lower transmission line to the beginning end of the next upper transmission line in the same manner as shown in FIG. 3. Hence, as illustrated in FIG. 1, metallic connectors 36, 38, 40, and 42 electrically connect transmission lines 20 to 22, 22 to 24, 24 to 26, and 26 to 28 respectively. Thus, in the case of the LC network shown in FIG. 1, there would be at least seven ceramic layers, each having bottom and top planar surfaces the latter of which the aforementioned transmissions are formed respectively thereon. As further illustrated in FIG. 1, LC structure 10 is centered tapped at 30 to provide an output 44. Output 44 is coupled at 46 to a capacitance $C_{DS}$, the parasitic capacitance of a FET for instance, as will be described hereinafter.

Figure 2:
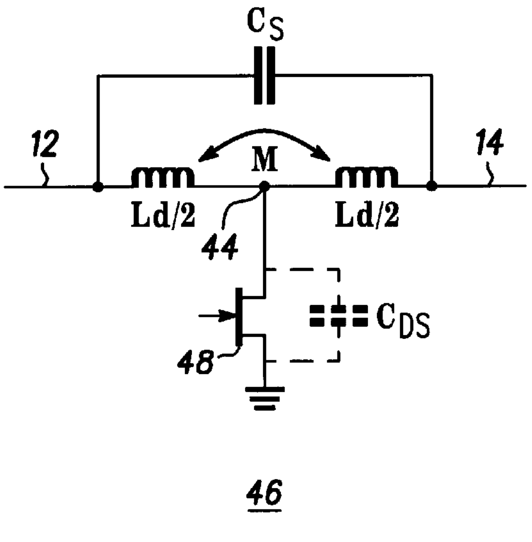
FIG. 2 is a lumped-element schematic of the constant "R" network of the present invention.

Turning to FIG. 2, the ideal high frequency equivalent of LC structure 10 is shown at 46, which, when connected to the drain of FET 48 at 44, functions as a constant "R" network as is understood. Thus, inductance Ld/2 established between end 12 and node 44 (the center tap point 30) at the frequency of operation is equal to the inductance created by transmission lines 16, 18, 20, and one-half of transmission line 22. Similarly, the inductance Ld/2 established between node 44 and end 14 is equal to the inductance created by transmission lines 24, 26, 28, and the latter one-half of transmission line 22. The total capacitance, $C_S$, established between end 12 and end 14 is the sum of the individual capacitances created between adjacent transmission lines and the thickness of the ceramic layer therebetween. The value of $C_S$ can be tailored by, among other things, varying the thickness of the ceramic layers and the widths of the transmission lines. By tightly wrapping overlaying transmission lines of LC structure 10, the mutual inductance M can be maximized. LC transmission line structure 10 is illustrated as being coupled to the drain of FET 48 the source of which is returned to ground potential. $C_{DS}$ is the parasitic drain to source capacitance of FET 48 and varies with the size thereof.

Hence, what has been described above is a novel constant "R" network 46 formed using multiple low temperature co fired ceramic layers that form a complete ceramic structure. The inductances and capacitances associated with network 46 are balanced and if necessary can be adjusted by varying ceramic layer thickness, transmission line widths and the tightness of the inductance wrap. Although LC transmission line structure 10 is shown as being rectangular in shape it is not conclusive. LC transmission line structure 10 could be any numbered of geometric shapes such as a spiral and a square for instance.

Figure 4:
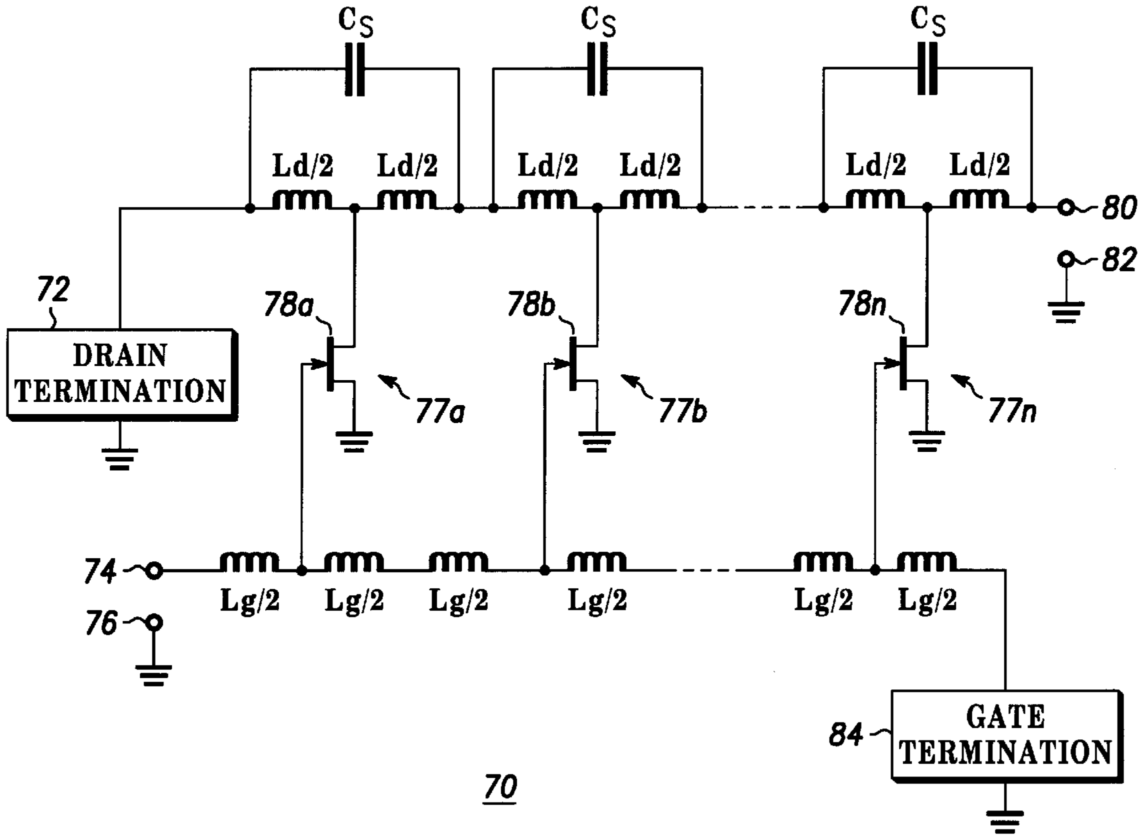
FIG. 4 is a schematic representation of a constant "R" FET distributed amplifier of the present invention.

Turning to FIG. 4, simplified high frequency distributed amplifier 70 is shown that incorporates constant "R" networks described above. Amplifier 70 is formed of low temperature co fired ceramic (LTTC) structure 50. Distributed amplifier 70 includes multiple cascaded constant "R" networks 77*a*, 77*b* through 77*n* with their associated FETs 78*a*, 78*b* through 78*n*. The cascaded constant "R" networks form a "transmission line" for coupling an input wave signal across outputs 80 and 82. The drains of the FETs comprising distributed amplifier 70 are terminated by drain termination 72. An input signal is applied across input terminals 74 and 76, the latter of which is coupled to ground reference. The series inductances consisting of $L_g/2$ form an artificial transmission line between input terminal 74 and gate termination 84.

In operation, an input signal applied across inputs 74 and 76 will travel down the transmission line and be proportionally coupled to each of the gate electrodes of respective FETs 78*a*–78*n*. Each of the FETs of a respective cascaded constant "R" network provides gain from its gate to drain and propagates the amplified signal down the drain transmission line formed by the constant "R" network as understood. Each FET gain stage provides a predetermined phase (ϕ) delay from gate to drain. By using drain and gate tapering techniques at each FET gain stage, the phase delayed signals can be added to provide overall amplification of the input signal that appears at outputs 80 and 82. Additionally, tapering each constant "R" network, each individual FET gain stage will have the same load impedance to the traveling input wave signal to provide maximum efficiency and amplification through the distributed amplifier. The constant "R" networks are tapered for loading the input signal applied thereto by, among other techniques, changing the lengths and widths of the transmission lines forming the inductance, L, as well as the individual capacitance of CS.

Hence, what has been described above is a novel tapered constant "R" network distributed amplifier incorporated into a multi-layer low temperature co fired ceramic structure. By using gate and drain tapering along with the cascaded constant "R" networks the amplifier exhibits a wide bandwidth while using large periphery semiconductor power devices. In addition, by fabricating the tapered constant "R" network distributed amplifier in a multi-layer low temperature co fired ceramic structure, the tight coupling coefficients, which are required to realize the constant "R" networks make the aforedescribed novel amplifier practical to make. Thus, a low cost high efficiency broadband power amplifier is achieved using the teaching of the present invention, which can be used in software defined radio applications for example.

What is claimed is:

1. An LC structure suited for use in high frequency amplifier operation, comprising:

a plurality of ceramic layers each layer having a top and bottom planar surface and a predetermined thickness thereto;

a plurality of transmission lines, one each of said plurality of transmission lines being selectively formed on a respective one of said plurality of ceramic layers, each one of said plurality of transmission lines having a predetermined geometric shape associated therewith and further having predetermined widths and thickness, each one of said plurality of transmission line also having a beginning end and a distal end;

each of said adjacent upper ceramic layers having a via formed there through next to said beginning end of said transmission line formed on said adjacent upper ceramic layer which overlays said distal end of said transmission line formed on the adjacent lower ceramic layer; and electrically conductive metal, said metal being formed through said via for connecting said distal end of said transmission line of said adjacent lower ceramic layer to said beginning end of said transmission line of said adjacent upper ceramic layer.

2. The LC structure of claim 1 wherein said plurality of ceramic layers are low temperature co-fired ceramic and are bonded together to form a monolithic structure.

3. The LC structure of claim 1 wherein said plurality of transmission lines are generally rectangular in shape.

4. An LC structure suited for use in high frequency amplifier operation, comprising:

a plurality of ceramic layers each layer having a top and bottom planar surface and a predetermined thickness thereto;

a plurality of transmission lines, one each of said plurality of transmission lines being selectively formed on a respective one of said plurality of ceramic layers, each one of said plurality of transmission lines having a predetermined geometric shape associated therewith and further having predetermined widths an thickness, each one of said plurality of transmission line also having a beginning end and a distal end;

means for electrically connecting the distal end of a transmission line formed on a lower ceramic layer to the beginning end of a transmission line formed on the next adjacent ceramic layer; and an output coupled to the middle of the transmission line formed on the middle one of said plurality of ceramic layers such that there are an arbitrary number of transmission lines below and above said transmission line formed on said middle one of said ceramic layers.

5. The LC structure of claim 4 wherein said output is coupled to the drain electrode of a transistor while the source electrode of said transistor is coupled to a ground reference potential and said transistor further having a gate electrode whereby said LC structure and said transistor form a constant "R" network.

6. An LC structure suited for use in high frequency amplifier operation, comprising:

a plurality of ceramic layers each layer having a top and bottom planar surface and a predetermined thickness thereto;

a plurality of transmission lines, one each of said plurality of transmission lines being selectively formed on a respective one of said plurality of ceramic layers, each one of said plurality of transmission lines having a predetermined geometric shape associated therewith and further having predetermined widths and thickness, each one of said plurality of transmission line also having a beginning end and a distal end; and means for electrically connecting the distal end of a transmission line formed on a lower ceramic layer to the beginning end of a transmission line formed on the next adjacent ceramic layer;

wherein said plurality of transmission lines are generally circular.

7. A constant "R" network for use in an amplifier, comprising:

a plurality of ceramic layers, each layer having a top and bottom planar surface and a predetermined thickness thereto, said ceramic layers being formed in a stack;

a plurality of transmission lines, one each of said plurality of transmission lines being selectively formed on a respective one of said plurality of ceramic layers, each one of said plurality of transmission lines having a predetermined geometric shape associated therewith and further having predetermined widths and thickness, each one of said plurality of transmission line also having a beginning end and a distal end;

each of said adjacent upper ceramic layers having a via formed there through next to said beginning end of said transmission line formed on said adjacent upper ceramic layer which overlays said distal end of said transmission line formed on the adjacent lower ceramic layer; and electrically conductive metal, said metal being formed through said via for connecting said distal end of said transmission line of said adjacent lower ceramic layer to said beginning end of said transmission line of said adjacent upper ceramic layer.

8. The constant "R" network of claim 7 having an output coupled to the middle of the transmission line formed on the middle one of said plurality of ceramic layers such that there is an arbitrary number of transmission lines below and above said transmission line formed on said middle one of said ceramic layers.

9. The constant "R" network of claim 8 further comprising a field effect transistor (FET) having a drain electrode coupled to said output of said middle of the transmission line formed on said middle one of said ceramic layers, a source electrode adopted to be connected to a ground reference potential, and a gate electrode.

10. The constant "R" network of claim 9 wherein said plurality of transmission lines are generally rectangular in shape.

11. The constant "R" network of claim 9 wherein said plurality of transmission lines are generally circular in shape.

12. The constant "R" network of claim 9 forming a portion of a distributed amplifier having an input and an output and including:

drain termination circuitry for providing termination impedance to said drain electrode of said FET, said drain termination circuitry being coupled to the beginning end of said of the transmission line formed on the bottom ceramic layer of said plurality of ceramic layers;

a transmission line coupled between the input of the distributed amplifier and said gate electrode of said FET;

gate termination circuitry coupled to said gate of said FET for providing termination impedance to said gate electrode; and the distal end of the transmission line formed on the top ceramic layer of said plurality of ceramic layers being coupled to the output of the distributed amplifier.

* * * * *

UNITED STATES PATENT AND TRADEMARK OFFICE

CERTIFICATE OF CORRECTION

PATENT NO. : 6,714,095 B2 Page 1 of 1
DATED : March 30, 2004
INVENTOR(S) : Anthony M. Pavio and Lei Zhao It is certified that error appears in the above-identified patent and that said Letters Patent is hereby corrected as shown below:

Column 4,
Line 30, change "widths an thickness," to -- widths and thickness, --.

Signed and Sealed this

Third Day of August, 2004

JON W. DUDAS
*Acting Director of the United States Patent and Trademark Office*